United States Patent
Bennett et al.

(10) Patent No.: US 8,884,265 B2
(45) Date of Patent: Nov. 11, 2014

(54) STRAINED INGAAS QUANTUM WELLS FOR COMPLEMENTARY TRANSISTORS

(71) Applicants: Brian R. Bennett, Arlington, VA (US); John Bradley Boos, Springfield, VA (US); Theresa F. Chick, Alexandria, VA (US); James G. Champlain, Alexandria, VA (US)

(72) Inventors: Brian R. Bennett, Arlington, VA (US); John Bradley Boos, Springfield, VA (US); Theresa F. Chick, Alexandria, VA (US); James G. Champlain, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/156,592

(22) Filed: Jan. 16, 2014

(65) Prior Publication Data

US 2014/0264278 A1  Sep. 18, 2014

Related U.S. Application Data

(60) Provisional application No. 61/779,167, filed on Mar. 13, 2013.

(51) Int. Cl.
 *H01L 21/24* (2006.01)
 *H01L 29/15* (2006.01)
 *H01L 29/778* (2006.01)

(52) U.S. Cl.
 CPC ............ *H01L 29/151* (2013.01); *H01L 29/778* (2013.01)
 USPC ............ 257/9; 257/E21.403; 257/11; 257/14; 257/15

(58) Field of Classification Search
 CPC ................. H01L 21/02365; H01L 31/035236; H01L 21/24
 USPC ............ 257/9, 11, 14, 15, E29.069, E29.072, 257/E29.168, E29.248, E31.033, E33.008, 257/E49.003
 See application file for complete search history.

(56) References Cited

U.S. PATENT DOCUMENTS

| | | | |
|---|---|---|---|
| 4,774,554 A * | 9/1988 | Dentai et al. | 372/46.012 |
| 4,833,101 A * | 5/1989 | Fujii | 117/105 |
| 7,429,747 B2 | 9/2008 | Hudait et al. | |
| 8,461,664 B2 | 6/2013 | Bennett et al. | |
| 2003/0089392 A1 | 5/2003 | Rohr et al. | |
| 2011/0147713 A1* | 6/2011 | Pillarisetty et al. | 257/24 |

OTHER PUBLICATIONS

R. Chau, B. Doyle, S. Datta, J. Kavalieros, and K. Zhang, "Integrated Nanoelectronics for the Future," Nature Materials 6, 810 812 (2007).
J. A. Del Alamo, Nature 479, 317 323 (2011).
J.A. Del Alamo, "The High Electron Mobility Transistor at 30: Impressive Accomplishments and Exciting Prospects," CS Mantech Proc., 17 22 (2011).

(Continued)

*Primary Examiner* — Julio J Maldonado
*Assistant Examiner* — Mohammad Choudhry
(74) *Attorney, Agent, or Firm* — US Naval Research Laboratory; Joslyn Barritt

(57) ABSTRACT

An InGaAs n-channel quantum well heterostructure for use in a complementary transistor having a Sb-based p-channel. The heterostructure includes a buffer layer having a lattice constant intermediate that of the n- and p-channel materials and which is configured to accommodate the strain produced by a lattice-constant mismatch between the n-channel and p-channel materials.

10 Claims, 6 Drawing Sheets

(56) References Cited

OTHER PUBLICATIONS

A.M. Kusters, A. Kohl, V. Sommer, R. Muller, and K. Heime, "Optimized double heterojunction pseudomorphic InP/InxGa1 xAs/InP (0.64×0.82) p MODFETs and the role of strain in their design," IEEE Transactions on Electron Devices 40, 2164 2170 (1993).

P. Nagaiah, V. Tokranov M. Yalimov, and S. Oktyabrsky, "Strained Quantum Wells for p Channel InGaAs CMOS," Performance and Reliability of Semiconductor Devices MRS Proc. 1108, 231 236 (2009).

T. J. Drummond, T.E. Zaipperian, I.J. Fritz, J.E. Schirber, and T.A. Plut, "p channel, strained quantum well, field effect transistor," Applied Physics Letters 49, 461 463 (1986).

M. Kudo, H. Matsumoto, T. Tanimoto, T. Mishima, and I. Ohbu, "Improved hole transport properties of highly strained In0.35Ga0.65As channel double modulation doped structures grown by MBE on GaAs," Journal of Crystal Growth 175, 910 914 (1997).

M.L. Lee, E.A. Fitzgerald, M.T. Bulsara, M.T. Currie, and A. Lochtefeld, "Strained Si, SiGe, and Ge channels for high mobility metal oxide semiconductor field effect transistors," Journal of Applied Physics 97, 011101, (2005).

M. Radosavljevic, et al., "High performance 40nm gate length InSb p channel compressively strained quantum well field effect transistors for low power (VCC=0.5V) logic applications," IEEE International Electron Devices Meeting 2008, Technical Digest, 727 730.

J.B. Boos, B.R. Bennett, N.A. Papanicoclaou, M.G. Ancona, J.G. Champlain, R. Bass, and B.V. Shanabrook, "High Mobility p channel HFETs using strained Sb based materials," Electronics Letters 43, 834-835 (2007).

B.R. Bennett, M.G. Ancona, and J.B. Boos, "Compound Semiconductors for Low Power p Channel Field Effect Transistors," MRS Bulletin 34, 530 536 (2009).

A. Nainani, B.R. Bennett, J.B. Boos, M.G. Ancona, and K.C. Saraswat, "InxGa1 xSb channel p metal oxide semiconductor field effect transistors: Effect of strain and heterostructure design," Journal of Applied Physics 111 (2012).

B.R. Bennett, M.G. Ancona, J.B. Boos, C.B. Canedy, and S.A. Khan, "Strained GaSb/AlAsSb quantum wells for p channel field effect transistors," Journal of Crystal Growth 311, 47 53 (2008).

B.R. Bennett, T F Chick, M.G. Ancona, and J.B. Boos, "Enhanced hole mobility and density in GaSb quantum wells," Solid State Electronics 79, 274 280 (2013).

V. Tokranov, P. Nagaiah, M. Yakimov, R.J. Matyi, and S. Oktyabrsky, "AlGaAsSb superlattice buffer layer for p channel GaSb quantum well on GaAs substrate," Journal of Crystal Growth 323, 35 38 (2011).

B.R. Bennett, M.G. Ancona, J.B. Boos, and B.V. Shanabrook, "Mobility enhancement in strained p-InGaSb quantum wells," Applied Physics Letters 91, 042104 (2007).

B.R. Bennett, R. Magno, J.B. Boos, W. Kruppa, and M.G. Ancona, "Antimonide Based Compound Semiconductors for Electronic Devices: A Review," Solid State Electronics 49, 1875 1895 (2005).

A. Nainani, T. Irisawa, Z. Yuan, B.R. Bennett, J.B. Boos, Y. Nishi, and K.C. Saraswat, "Optimization of the Al2O3/GaSb Interface and a High Mobility GaSb pMOSFET," IEEE Transactions on Electron Devices 58, 3407 3415 (2011).

A. Nainani, Z. Yuan, T. Krishnamohan, B.R. Bennett, J.B. Boos, M. Reason, M.G. Ancona, Y. Nishi, and K.C. Saraswat, "InxGa1 xSb channel p metal oxide semiconductor field effect transistors: Effect of strain and heterostructure design," Journal of Applied Physics 110 (2011).

M. Xu, R. R S. Wang, and P.D. Ye, "GaSb Inversion Mode PMOSFETs With Atomic Layer Deposited Al2O3 as Gate Dielectric," IEEE Electron Device Letters 32, 883 885 (2011).

T. Ashley, L. Buckle, S. Datta, M.T. Emeny, D.G. Hayes, K.P. Hilton, R. Jefferies, T. Martin, T. Phillips, D.J. Wallis, P.J. Wilding, and R. Chau, "Heterogeneous InSb quantum well transistors on silicon for ultra high speed, low power logic applications," Electronics Letters 43, 777 779 (2007).

M.G. Ancona, B.R. Bennett, and J.B. Boos, "Scaling Projections for Sb based p channel FETs," Solid State Electronics 54, 1349 1358 (2010).

B.R. Bennett, M.G. Ancona, J.G. Champlain, N.A. Papanicolaou, and J.B. Boos, "Demonstration of high mobility electron and hole transport in a single InGaSb well for complimentary circuits," Journal of Crystal Growth 312, 37 40 (2009).

L. Desplanque, D. Vignaud, S. Godey, E. Cadio, S. Plissard, X. Wallart, P. Liu, and H. Sellier, "Electronic properties of the high electron mobility Al0.56In0.44Sb/Ga0.5In0.5 Sb heterostructure," Journal of Applied Physics 108, 043704 (2010).

R. Loesch, R. Aidam, L. Kirste, and A. Leuther, "Molecular beam epitaxial growth of metamorphic AlInSb/GaInSb high electron mobility transistor structures on GaAs substrates for low power and high frequency applications," Journal of Applied Physics 109, 033706 (2011).

A. Ali, H. Madan, A. Agrawal, I. Ramirez, R. Misra, J.B. Boos, B.R. Bennett, J. Lindemuth, and S. Datta, "Enhancement Mode Antimonide Quantum Well MOSFETs With High Electron Mobility and GHz Small Signal Switching Performance," IEEE Electron Device Letters 32, 1689 1691 (2011).

B.R. Bennett, T.F. Chick, J.B. Boos, J.G. Champlain, and A.A. Podpirka, "Strained InGaAs/InAlAs quantum wells for complementary III—V transistors," Journal of Crystal Growth 388 (2014).

H. Li, J. Wu, Z. Wang, J. Liang, B. Xu, C. Jiang, Q. Gong, F. Liu, and W. Zhou, "Growth and characterization of InGaAs/InAlAs/InP high-electron-mobility transistor structures towards high channel conductivity," Journal of Crystal Growth 186 (1998) 309-314.

N. J. Ekins-Daukes, K. W. J. Barnham, J. P. Connolly, J. S. Roberts, J. C. Clark, G. Hill, and M. Mazzer, "Strain-balanced GaAsP/InGaAs quantum well solar cells," Applied Physics Letters vol. 75, No. 26, pp. 4195-4197 (1999).

* cited by examiner

| Growth # | x in $In_xGa_{1-x}As$ n-Channel Layer | Periods in Buffer Layer | Duty Cycle of AlGaSb/AlGaAs | Growth Interrupts | Best Mobility @300K | Density @300K (x 10^12) | Mobility @77K | Buffer Lattice Constant | Strain in Channel | Strain in Barrier | RMS Roughness | Sheet Resistance |
|---|---|---|---|---|---|---|---|---|---|---|---|---|
| | | | s | | cm²/Vs | cm⁻² | cm²/Vs | Å | % | % | nm | Ω/□ |
| 1 | 0.64 | 777 | 3.5/1.5 | N | 3600 | 1.92 | 4600 | 6.000 | -1.46 | -2.20 | 0.83 | 903 |
| 2 | 0.64 | 1554 | 3.7/1.3 | Y | 9900 | 2.79 | 14600 | 5.985 | -1.21 | -1.96 | 1.05 | 226 |
| 3 | 0.80 | 888 | 3.7/1.3 | Y | 10200 | 1.02 | 16000 | 6.000 | -0.38 | -2.21 | 0.76 | 602 |
| 4 | 0.80 | 888 | 3.9/1.1 | Y | 11300 | 2.08 | 30000 | 5.982 | -0.08 | -1.91 | 0.87 | 266 |
| 5 | 1.00 | 1554 | 3.7/1.3 | Y | 9300 | 3.92 | 15900 | 5.968 | 1.52 | -1.68 | 0.92 | 171 |

FIG. 3

STRAINED INGAAS QUANTUM WELLS FOR COMPLEMENTARY TRANSISTORS

CROSS-REFERENCE

This application is a Nonprovisional of and claims the benefit of priority under 35 U.S.C. §119 based on U.S. Provisional Patent Application No. 61/779,167 filed on Mar. 13, 2013, the entirety of which is hereby incorporated by reference into the present application.

TECHNICAL FIELD

The present invention relates to field-effect transistors for ultra-low-power complementary circuits, particularly the development of a common epitaxial buffer layer material that can be used for both the n- and p-channel portions of such complementary circuits.

BACKGROUND

Recently, there has been considerable interest in the potential of field-effect transistors (FETs) using III-V semiconductor materials for advanced logic applications. See R. Chau, B. Doyle, S. Datta, J. Kavalieros, and K. Zhang, "Integrated Nanoelectronics for the Future," *Nature Materials* 6, 810-812 (2007); and J. A. del Alamo, *Nature* 479, 317-323 (2011). A high-speed, low-power logic technology utilizing such III-V materials could enhance digital circuit functionality and sustain Moore's law for additional generations. When utilized in mixed-signal circuits, such materials can also enable a significant reduction in power consumption.

For these applications, complementary circuits based on n- and p-channel FETs would be highly desirable due to their low-power, high-speed advantages. A key issue is the composition of the channel and barrier materials for both the n-FET and the p-FET. A strong candidate for the n-FET is a high-mobility InGaAs channel clad by InAlAs barriers. This can take advantage of the mature InP high-electron-mobility transistor (HEMT) technology—so named because InP is usually used as a substrate for lattice-matched or strained InGaAs and InAlAs. Integrated circuits based on InP HEMTs are used in a variety of microwave applications including cell phones, cellular base stations, fiber optic systems, radar, radio astronomy, and satellite communications. See J. A. del Alamo, "The High Electron Mobility Transistor at 30: Impressive Accomplishments and Exciting Prospects," *CS Mantech Proc.*, 17-22 (2011).

Quantum wells of InGaAs/InAlAs have a sufficient valence band offset for hole confinement, and so one CMOS option is to combine InGaAs p-FETs and n-FETs. A few groups have investigated p-type modulation doped InGaAs/InAlAs QWs, but the hole mobilities in such materials are only 200-400 $cm^2/V$ s at room temperature, which will limit the performance of InGaAs p-FETs. See A. M. Kusters, A. Kohl, V. Sommer, R. Muller, and K. Heime, "Optimized double heterojunction pseudomorphic InP/In$_x$Ga$_{1-x}$As/InP ($0.64 \leq x \leq 0.82$) p-MODFETs and the role of strain in their design," *IEEE Transactions on Electron Devices* 40, 2164-2170 (1993); P. Nagaiah, V. Tokranov, M. Yakimov, and S. Oktyabrsky, "Strained Quantum Wells for p-Channel InGaAs CMOS," *Performance and Reliability of Semiconductor Devices MRS Proc.* 1108, 231-236 (2009); T. J. Drummond, T. E. Zipperian, I. J. Fritz, J. E. Schirber, and T. A. Plut, "p-channel, strained quantum well, field-effect transistor," *Applied Physics Letters* 49, 461-463 (1986); and M. Kudo, H. Matsumoto, T. Tanimoto, T. Mishima, and I. Ohbu, "Improved hole transport properties of highly strained In$_{0.35}$Ga$_{0.65}$As channel double-modulation-doped structures grown by MBE on GaAs," *Journal of Crystal Growth* 175, 910-914 (1997). In contrast, mobilities greater than 2000 $cm^2/V$ s have been achieved for strained Ge/SiGe QWs. See M. L. Lee, E. A. Fitzgerald, M. T. Bulsara, M. T. Currie, and A. Lochtefeld, "Strained Si, SiGe, and Ge channels for high-mobility metal-oxide-semiconductor field-effect transistors," *Journal of Applied Physics* 97, 011101 (2005). Consequently, a second option is to combine InGaAs n-FETs with Ge p-FETs. See J. A. Del Alamo, supra. Integration is a challenge with this approach, however, because of the different crystalline structures and lattice constants for the two material systems.

The use of antimonide-based materials for both the n- and p-channels is also an attractive possibility, since they have excellent electronic properties and may enable the use of materials having the same buffer layer. For example, antimonide quantum wells have been used in Schottky-barrier p-FETs with good DC and microwave performance. See M. Radosavljevic, T. Ashley, A. Andreev, S. D. Coomber, G. Dewey, M. T. Emeny, M. Fearn, D. G. Hayes, K. P. Hilton, M. K. Hudait, R. Jefferies, T. Martin, R. Pillarisetty, W. Rachmady, T. Rakshit, S. J. Smith, M. J. Uren, D. J. Wallis, P. J. Wilding, and R. Chau, "High-performance 40 nm gate length InSb p-channel compressively strained quantum well field effect transistors for low-power (VCC=0.5V) logic applications," *IEEE International Electron Devices Meeting* 2008, *Technical Digest*, 727-730; see also J. B. Boos, B. R. Bennett, N. A. Papanicolaou, M. G. Ancona, J. G. Champlain, R. Bass, and B. V. Shanabrook, "High mobility p-channel HFETs using strained Sb-based materials," *Electronics Letters* 43, 834-835 (2007).

Work on enhancing the hole mobilities of such materials for p-FET applications has been encouraging. Confinement and biaxial strain have been used to lift the heavy-hole/light-hole degeneracy, reduce the effective mass, and enhance the hole mobility, see B. R. Bennett, M. G. Ancona, and J. B. Boos, "Compound Semiconductors for Low-Power p-Channel Field-Effect Transistors," *MRS Bulletin* 34, 530-536 (2009); and A. Nainani, B. R. Bennett, J. B. Boos, M. G. Ancona, and K. C. Saraswat, "InxGa1-xSb channel p-metal-oxide-semiconductor field effect transistors: Effect of strain and heterostructure design," *Journal of Applied Physics* 111 (2012), with room-temperature hole mobilities as high as 1100-1500 $cm^2/V$ s for InSb, GaSb, and InGaSb having been reported. See Radosavljevic, supra; see also B. R. Bennett, M. G. Ancona, J. B. Boos, C. B. Canedy, and S. A. Khan, "Strained GaSb/AlAsSb quantum wells for p-channel field-effect transistors," *Journal of Crystal Growth* 311, 47-53 (2008); B. R. Bennett, T. F. Chick, M. G. Ancona, and J. B. Boos, "Enhanced hole mobility and density in GaSb quantum wells," *Solid-State Electronics* 79, 274-280 (2013); V. Tokranov, P. Nagaiah, M. Yakimov, R. J. Matyi, and S. Oktyabrsky, "AlGaAsSb superlattice buffer layer for p-channel GaSb quantum well on GaAs substrate," *Journal of Crystal Growth* 323, 35-38 (2011); and B. R. Bennett, M. G. Ancona, J. B. Boos, and B. V. Shanabrook, "Mobility enhancement in strained p-InGaSb quantum wells," *Applied Physics Letters* 91, 042104 (2007).

The use of antimonide/arsenide heterostructures for n-FETs and other electronic devices has also been explored. See B. R. Bennett, R. Magno, J. B. Boos, W. Kruppa, and M. G. Ancona, "Antimonide-Based Compound Semiconductors for Electronic Devices: A Review," *Solid-State Electronics* 49, 1875-1895 (2005).

(In)GaSb-channel MOSFETs have also been fabricated. Such MOSFETs are attractive because they have a much lower gate leakage current, which is a critical requirement in low-power logic circuits. See A. Nainani, T. Irisawa, Z. Yuan, B. R. Bennett, J. B. Boos, Y. Nishi, and K. C. Saraswat, "Optimization of the Al2O3/GaSb Interface and a High-Mobility GaSb pMOSFET," *IEEE Transactions on Electron Devices* 58, 3407-3415 (2011); A. Nainani, Z. Yuan, T. Krishnamohan, B. R. Bennett, J. B. Boos, M. Reason, M. G. Ancona, Y. Nishi, and K. C. Saraswat, "$In_xGa_{1-x}Sb$ channel p-metal-oxide-semiconductor field effect transistors: Effect of strain and heterostructure design," *Journal of Applied Physics* 110 (2011); S. Oktyabrsky, *Fundamentals of III-V Semiconductor MOSFETs*, 349-378 (2010); and M. Xu, R. S. Wang, and P. D. Ye, "GaSb Inversion-Mode PMOSFETs With Atomic-Layer-Deposited Al2O3 as Gate Dielectric," *IEEE Electron Device Letters* 32, 883-885 (2011).

The antimonide heterostructures used for p-FETs have type-I band alignments, with substantial conduction—as well as valence—band offsets. Consequently, a third option for a III-V CMOS is to use antimonide QWs for both n- and p-FETs. For InSb QWs, high-frequency n-FETs have been reported. See T. Ashley, L. Buckle, S. Datta, M. T. Emeny, D. G. Hayes, K. P. Hilton, R. Jefferies, T. Martin, T. Phillips, D. J. Wallis, P. J. Wilding, and R. Chau, "Heterogeneous InSb quantum well transistors on silicon for ultra-high speed, low power logic applications," *Electronics Letters* 43, 777-779 (2007).

One potential limitation to InSb QWs for integrated n- and p-FETs is that simulations suggest it may be difficult to attain high $I_{ON}/I_{OFF}$ ratios because of the small band gap and band offsets. See M. G. Ancona, B. R. Bennett, and J. B. Boos, "Scaling Projections for Sb-based p-channel FETs," *Solid-State Electronics* 54, 1349-1358 (2010).

To address this problem, researchers at the Naval Research Laboratory have proposed the use of the same InGaSb channel for both the n- and p-FETs in a CMOS device. See U.S. Pat. No. 8,461,664 to B. R. Bennett, J. B. Boos, M. G. Ancona, J. G. Champlain, and N. A. Papanicolaou, entitled "n- and p-Channel Field Effect Transistors with Single Quantum Well for Complementary Circuits" (2013); see also B. R. Bennett, M. G. Ancona, J. G. Champlain, N. A. Papanicolaou, and J. B. Boos, "Demonstration of high-mobility electron and hole transport in a single InGaSb well for complementary circuits," *Journal of Crystal Growth* 312, 37-40 (2009). However, although high electron mobilities have been achieved, no group has reported a high-performance InGaSb n-FET. Id.; see also L. Desplanque, D. Vignaud, S. Godey, E. Cadio, S. Plissard, X. Wallart, P. Liu, and H. Sellier, "Electronic properties of the high electron mobility $Al_{0.56}In_{0.44}Sb/Ga_{0.5}In_{0.5}Sb$ heterostructure," *Journal of Applied Physics* 108, 043704 (2010); and R. Loesch, R. Aidam, L. Kirste, and A. Leuther, "Molecular beam epitaxial growth of metamorphic AlInSb/GaInSb high-electron-mobility-transistor structures on GaAs substrates for low power and high frequency applications," *Journal of Applied Physics* 109, 033706 (2011).

A fourth option is to combine p-channel InGaSb with n-channel InAsSb. See A. Ali, H. Madan, A. Agrawal, I. Ramirez, R. Misra, J. B. Boos, B. R. Bennett, J. Lindemuth, and S. Datta, "Enhancement Mode Antimonide Quantum Well MOSFETs With High Electron Mobility and GHz Small-Signal Switching Performance," *IEEE Electron Device Letters* 32, 1689-1691 (2011). In such structures, separate quantum wells are required for the n- and p-channels, but a common buffer layer could be used to prevent mismatches in the coefficients of thermal expansion. See U.S. Pat. No. 7,429,747 to M. K. Hudait, S. Datta, J. T. Kavalieros, M. L. Doczy, and R. S. Chau, entitled "Sb-Based CMOS Devices" (2008).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides an InGaAs n-channel quantum well heterostructure for use in a complementary transistor having a Sb-based p-channel, wherein the heterostructure includes a buffer layer having a lattice constant intermediate that of the n- and p-channel materials, wherein the buffer layer is configured to accommodate the strain produced by a lattice-constant mismatch between the n-channel and p-channel materials.

In an exemplary embodiment, a quantum well heterostructure in accordance with the present invention can include an InP substrate, an optional $In_wAl_{1-w}As$ first buffer layer disposed on the InP substrate; an $Al_zGa_{1-z}As_ySb_{1-y}$ second buffer layer disposed on the $In_wAl_{1-w}As$ layer; an $In_wAl_{1-w}As$ barrier layer disposed on the second buffer layer; an $In_xGa_{1-x}As$ n-channel layer disposed on the $In_wAl_{1-w}As$ barrier layer; a Te-delta doped $In_wAl_{1-w}As$ spacer layer disposed on the n-channel layer; an $In_wAl_{1-w}As$ barrier layer disposed on the spacer layer; and an $In_xGa_{1-x}As$ cap on the barrier layer. In a preferred embodiment, the optional $In_wAl_{1-w}As$ layer is lattice-matched to the InP substrate, but such lattice matching is not necessary.

In another exemplary embodiment, a quantum well heterostructure in accordance with the present invention can be configured for use with an (In)GaSb p-channel in a complementary transistor. Such a structure can include a 160 nm $In_{0.52}Al_{0.48}As$ n-channel first buffer layer on an InP substrate, the $In_{0.52}Al_{0.48}As$ being lattice-matched to InP, followed by a 0.9- to 2.8-µm $Al_{0.8}Ga_{0.2}As_ySb_{1-y}$ second buffer layer, a 6-nm $In_{0.52}Al_{0.48}As$ barrier layer, a 15-nm $In_xGa_{1-x}As$ (x=0.64-1.0) n-channel layer, a Te-delta doped 5-nm $In_{0.52}Al_{0.48}As$ spacer layer, a 4-nm $In_{0.52}Al_{0.48}As$ barrier layer, and a 2-nm $In_xGa_{1-x}As$ cap, wherein the $Al_{0.8}Ga_{0.2}As_ySb_{1-y}$ second buffer layer is configured to have a lattice constant intermediate that of the $In_xGa_{1-x}As$ n-channel and the (In)GaSb material used for the p-channel, the lattice constant of the $Al_{0.8}Ga_{0.2}As_ySb_{1-y}$ second buffer layer being configured to reduce the strain caused by a lattice mismatch between the $In_xGa_{1-x}As$ n-channel material and the (In)GaSb p-channel material.

In some embodiments, a quinternary InGaAlAsSb can be used for the second buffer layer instead of $Al_yGa_{1-y}As_zSb_{1-z}$.

In some embodiments, a GaAs or Si substrate can be used instead of InP, with the materials used for the first and second buffer layers being configured to accommodate the strain produced by a lattice-constant mismatch between the substrate and the quantum wells. Suitable materials may include SiGe, InGaAsP, and $SrTiO_3$.

In some embodiments, $In_{0.7}Al_{0.3}As$ can be used for the n-channel instead of $In_{0.52}Al_{0.48}As$.

In some embodiments, the second buffer layer can be an $Al_{0.8}Ga_{0.2}As_ySb_{1-y}$ digital alloy.

In some embodiments, GaSb alloys can be used for the p-channel, with buffer layers of AlGaA, InGaSb alloys can be used for the p-channel, and in such embodiments, buffer layers with lattice constants of about 6.0 to about 6.1 Å will be needed to avoid excessive lattice mismatch between the FET layers and buffer layer.

BRIEF DESCRIPTION OF THE DRAWINGS

FIG. 3 is a Table setting forth relevant parameters for five exemplary MBE-grown semiconductor wafers in accordance with the present invention.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a semiconductor device suitable for use in low-power electronic devices such as field-effect transistors (FETs), where the device includes complementary metal oxide semiconductor (CMOS) combining an n-FET and a high-mobility p-FET on an AlGaAsSb or InGaAlAs buffer layer.

To allow integration of high densities of n-FETs and p-FETs, it is highly desirable to use a common buffer layer. The lattice mismatch between the buffer layer and active layers of the transistors must be small enough to allow growth of high-quality epitaxial films.

Figure 1:
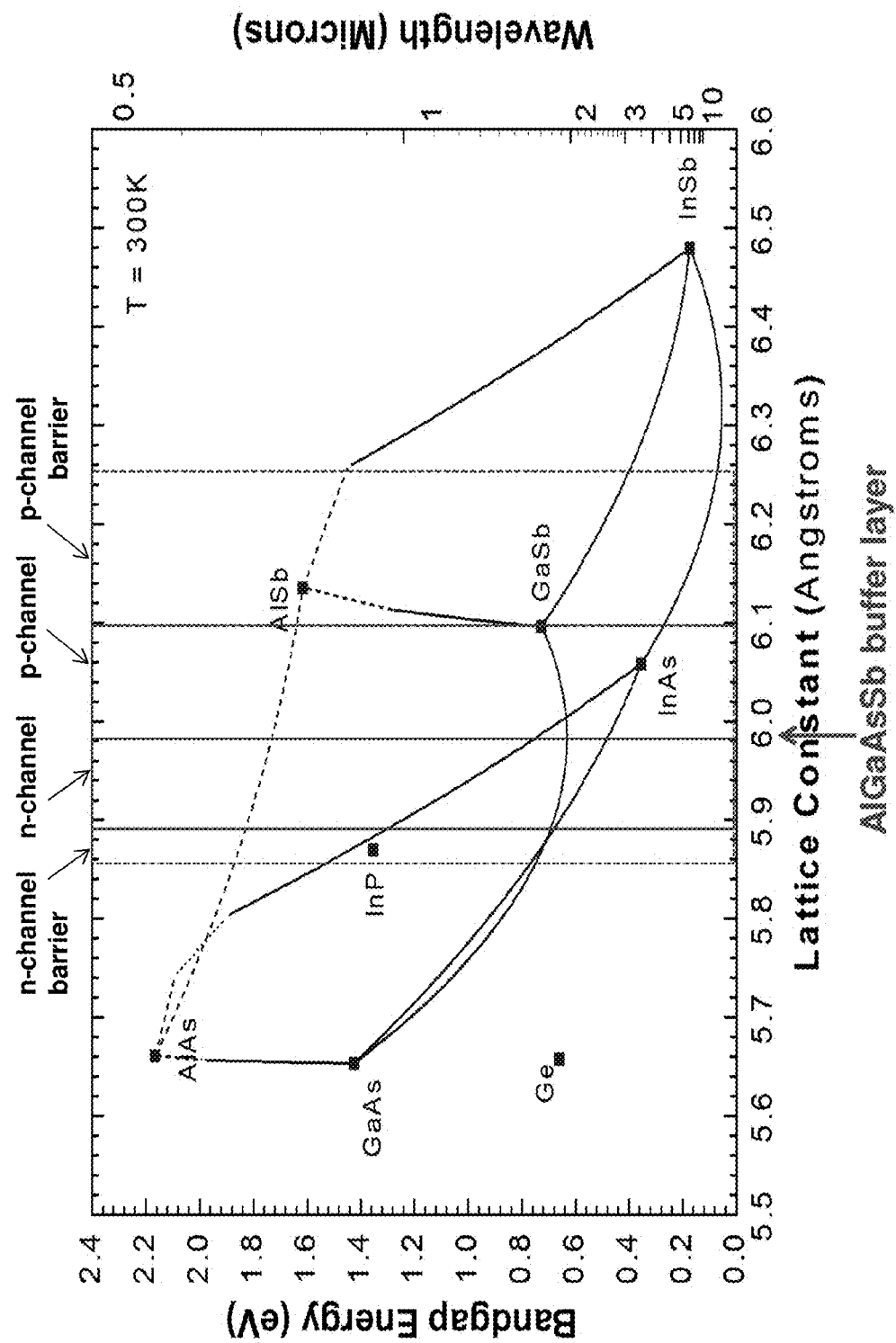
FIG. 1 is a plot showing bandgap energy as a function of lattice constant for certain arsenide and antimonide semiconductor materials.

FIG. 1 is a plot showing the most common lattice-constant ranges for the channel and barrier in n-channel InGaAs/InAlAs FETs as well as p-channel antimonide FETs. As noted above, many researchers have attempted to improve hole mobilities in such III-V CMOS structures, and much of the work has focused on the use of antimonides. The present invention is the result of work by researchers at the Naval Research Laboratory to provide another option for improving such hole mobilities by combining the relatively mature InGaAs n-FET technology with high-mobility (In)GaSb for the p-FET.

However, as can be seen from the plot in FIG. 1, the lattice constant for GaSb is about 6.10 Å, while the lattice constant for InP is about 5.86 Å, so that GaSb and InP have a lattice mismatch of nearly 4% which causes a strain between the GaSb and InP layers in the structure. In III-V epitaxy, strains greater than 2% usually lead to undesirable three-dimensional growth, and so the lattice mismatch between GaSb and InP might seem to preclude the use of GaSb as a p-FET on an InP substrate. Fortunately, the p-channels associated with GaSb are optimized for compressive stains of 1-2%. Consequently, if n-channel InGaAs/InAlAs quantum wells can tolerate a tensile strain of about 2%, it could be possible for both the n- and p-channel layers to have a common buffer layer with a lattice constant intermediate that of the p-channel material and that of the n-channel.

Thus, the present invention provides an InGaAs n-channel quantum well heterostructure for use in a complementary transistor having a Sb-based p-channel, wherein the heterostructure includes a buffer layer having a lattice constant intermediate that of the n- and p-channel materials, wherein the buffer layer is configured to accommodate the strain produced by a lattice-constant mismatch between the n-channel and p-channel materials.

In an exemplary embodiment, a quantum well heterostructure in accordance with the present invention can include an InP substrate, an optional $In_wAl_{1-w}As$ first buffer layer disposed on the InP substrate; an $Al_zGa_{1-z}As_ySb_{1-y}$ second buffer layer disposed on the $In_wAl_{1-w}As$ layer; an $In_vAl_{1-v}As$ barrier layer disposed on the second buffer layer; an $In_xGa_{1-x}As$ n-channel layer disposed on the $In_vAl_{1-v}As$ barrier layer; a Te-delta doped $In_wAl_{1-w}As$ spacer layer disposed on the n-channel layer; an $In_wAl_{1-w}As$ barrier layer disposed on the spacer layer; and an $In_xGa_{1-x}As$ cap on the barrier layer. In a preferred embodiment, the optional $In_wAl_{1-w}As$ layer is lattice-matched to the InP substrate, but such lattice matching is not necessary.

In some embodiments, x=0.53 to 1 in the $In_xGa_{1-x}As$ layer.

Figure 2:
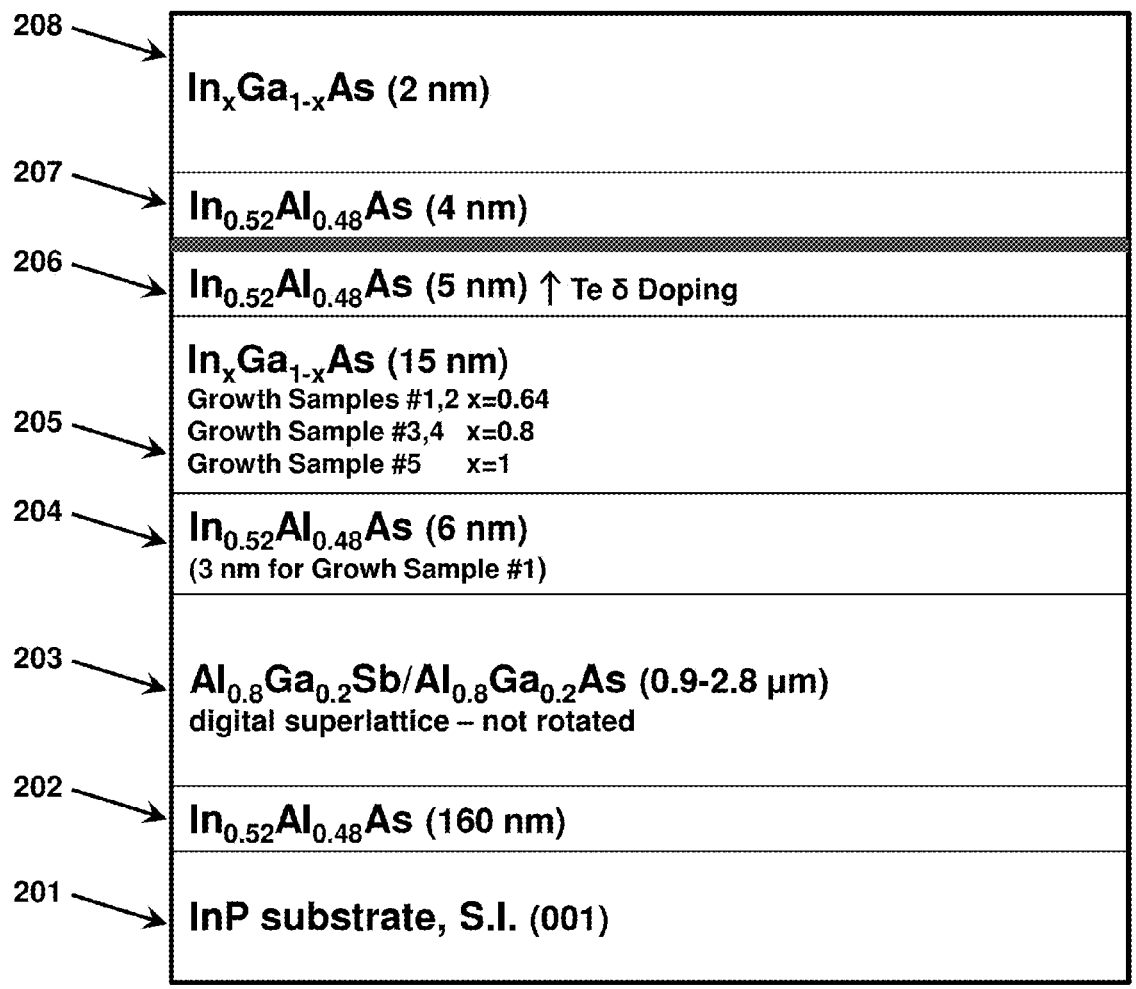
FIG. 2 is a block diagram illustrating aspects of an exemplary CMOS heterostructure in accordance with the present disclosure.

FIG. 2 is a block diagram illustrating a cross-section of a more specific exemplary embodiment of a quantum well heterostructure in accordance with the present invention configured for use with an (In)GaSb p-channel in a complementary transistor. As illustrated in FIG. 2, such a heterostructure can have a 160 nm $In_{0.52}Al_{0.48}As$ first buffer layer 202 on an InP substrate 201, the $In_{0.52}Al_{0.48}As$ being optionally lattice-matched to InP; a second buffer layer 203 comprising a 0.9- to 2.8-µm layer of a $Al_{0.8}Ga_{0.2}As_ySb_{1-y}$; a 6-nm $In_{0.52}Al_{0.48}As$ barrier layer 204; a 15-nm $In_xGa_{1-x}As$ (x=0.53-1.0) n-channel layer 205; a Te-delta doped 5-nm $In_{0.52}Al_{0.48}As$ spacer layer 206; a 4-nm $In_{0.52}Al_{0.48}As$ barrier layer 207; and a 2-nm $In_xGa_{1-x}As$ cap. In accordance with the present invention, the $Al_{0.8}Ga_{0.2}As_ySb_{1-y}$ second buffer layer is configured to have a lattice constant intermediate that of the $In_xGa_{1-x}As$ n-channel and the (In)GaSb material used for the p-channel, wherein the $Al_{0.8}Ga_{0.2}As_ySb_{1-y}$ second buffer layer is configured to accommodate the strain produced by a lattice-constant mismatch between the $In_xGa_{1-x}As$ n-channel material and the (In)GaSb p-channel material.

Examples

To test the electron mobility, density, and surface roughness of a CMOS having a heterostructure in accordance with the present invention, the inventors grew five wafers having the relevant parameters shown in the Table in FIG. 3. See B. R. Bennett, T. F. Chick, J. B. Boos, J. G. Champlain, and A. A. Podpirka, "Strained InGaAs/InAlAs quantum wells for complementary III-V transistors," *Journal of Crystal Growth* 388 (2014) 92-97, the entirety of which is incorporated by reference into the present disclosure.

The exemplary heterostructures studied by the inventors were grown by solid-source molecular beam epitaxy (MBE) on semi-insulating (001) InP substrates using a Riber Compact 21T MBE system. The MBE growth temperature was near 450° C. for the InAlAs buffer layer. The temperature was then raised to 510° C. for the $Al_{0.8}Ga_{0.2}As_ySb_{1-y}$ buffer layer, and then reduced to 450° C. for the remaining layers. As and Sb$_2$ were provided by valved cracking cells, and the Al$_{0.8}$Ga$_{0.2}$As$_y$Sb$_{1-y}$ buffer layers were grown as a short-period superlattice of Al$_{0.8}$Ga$_{0.2}$Sb and Al$_{0.8}$Ga$_{0.2}$As by toggling the As and Sb shutters while the Al and Ga shutters and the As and Sb valves remained open, allowing better control of composition compared to random alloys. The anion ratio was adjusted by changing the length of time the As shutter is open relative to the Sb shutter, e.g. 3.7 s Al$_{0.8}$Ga$_{0.2}$Sb/1.3 s Al$_{0.8}$Ga$_{0.2}$As. The Al$_{0.8}$Ga$_{0.2}$As$_y$Sb$_{1-y}$ is almost fully relaxed, with its composition dictating the amount of biaxial strain in the thin pseudomorphic InAlAs and InGaAs layers.

The InAlAs layers were grown at a rate of 1.0 monolayers (ML)/s, and the InGaAs layers were grown at 0.5 ML/s, as calibrated from reflection high-energy electron diffraction oscillations. Based upon previous results on this MBE system, we expected the layer thicknesses to be uniform to within 1% across the 76-mm-diameter substrate if the wafer is rotated. The wafers were rotated during the growth of all the layers except the Al$_{0.8}$Ga$_{0.2}$Sb/Al$_{0.8}$Ga$_{0.2}$As buffer layer superlattice, which was not rotated. This resulted in differing thicknesses of AlGaSb and AlGaAs and different anion mole fractions across each wafer. The buffer layer growth rate was 1.0 ML/s in the center of the wafer, and varied from 0.7 to 1.3 ML/s across the wafer. Several 5×5 mm squares were cleaved from different locations on each wafer to provide a range of samples with varying InGaAs and InAlAs strain in a highly efficient manner.

Hall/van der Pauw transport measurements were performed on a total of 34 samples at 300K, using magnetic fields of 0.37, 0.55 and 1.0 T. Measurements were performed at two current levels at each B field, and average values are given in this disclosure with standard deviations usually less than 5%. Atomic force microscopy (AFM) measurements were performed on two to five samples from each wafer to yield root-mean-square (rms) roughness over 5×5 μm regions for a variety of strains and electron mobilities. X-ray diffraction (XRD) measurements were made on a double-crystal system using Cu—Kα radiation and compared to simulations using dynamical diffraction theory.

Figures 4A, 4B, 4C:
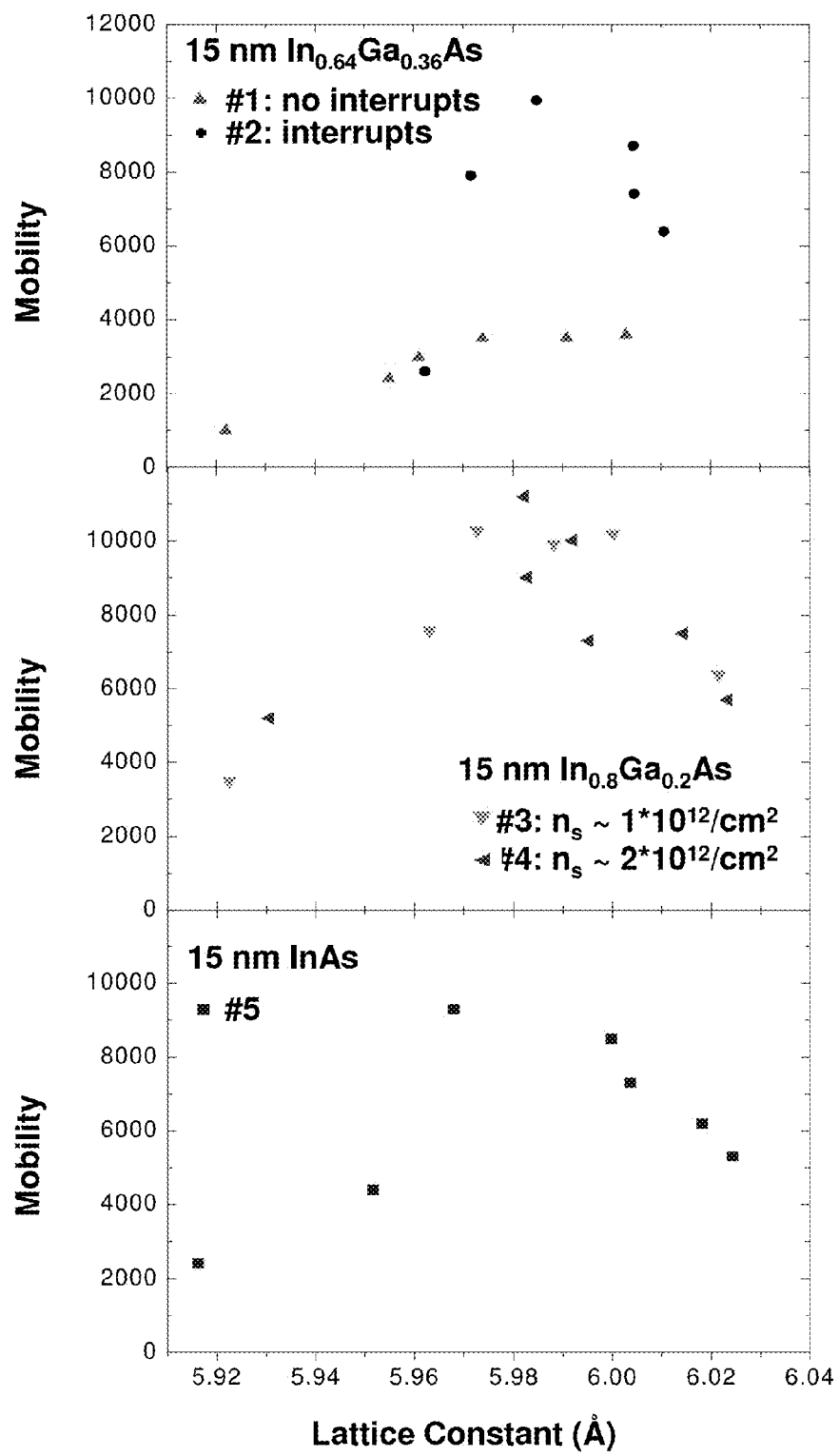
FIGS. 4A-4C are plots illustrating mobility as a function of lattice constant for the five exemplary MBE wafers having the parameters shown in the Table.

FIGS. 4A-4C are plots showing mobility vs. lattice constant for samples from all five growths. Growths #1 and #2 had 15 nm In$_{0.64}$Ga$_{0.36}$As buffer layers. Growth #2 had 0.2 s less Al$_{0.8}$Ga$_{0.2}$As and 0.2 s more Al$_{0.8}$Ga$_{0.2}$Sb per period compared to Growth #1. This should result in an overall shift to larger buffer layer lattice constants across the wafer. The data in FIG. 4A show that trend, although the range shown for each growth is also a function of which 5×5 mm samples were selected for characterization. For Growth #1, a 3 nm In$_{0.52}$Al$_{0.48}$As bottom barrier layer was grown, followed by 5 s under an As$_2$ flux and then the 15 nm channel. For Growth #2, the sequence was 2 nm In$_{0.52}$Al$_{0.48}$As, 30 s As$_2$ interrupt, 2 nm In$_{0.52}$Al$_{0.48}$As, 30 s As$_2$ interrupt, 2 nm In$_{0.52}$Al$_{0.48}$As, 5 s As$_2$ interrupt, InGaAs channel. The goal of the growth interrupts was to create a smoother starting surface for the channel deposition. The mobility results in FIG. 4A show that the thicker bottom barrier with growth interrupts did indeed result in higher electron mobilities, with values as high as 9900 cm$^2$/V-s at 300K.

FIG. 4B plots the mobility for growths #3 and 4, which had the same the same In$_{0.52}$Al$_{0.48}$As bottom barrier layer as in Growth #2 but with 15 nm In$_{0.80}$Ga$_{0.20}$As channel layers. Growths #3 and #4 were nominally identical except that the GaTe shutter was open for 120 s for Growth #4 compared to 60 s for Growth #3. As expected, the measured densities for Growth #4 were near 2×10$^{12}$/cm$^2$ compared to 1×10$^{12}$/cm$^2$ for Growth #3. The room-temperature mobilities peak at lattice constants of 5.97-6.00 Å, similar to the results of Growth #2. The highest values were 10,200 cm$^2$/V-s for Growth #3 and 11,300 cm$^2$/V-s for Growth #4.

A pure InAs channel was used for Growth #5, with the same In$_{0.52}$Al$_{0.48}$As bottom barrier layer as in Growth #2. The mobilities for Growth #5 are plotted in FIG. 4C. As can be seen from the Table in FIG. 3, the characteristics for Growth #5 are similar to those for the other Growths, with a peak mobility of 9300 cm$^2$/V-s at a lattice constant of 5.97 Å. The mobilities of 9000-11,000 cm$^2$/V s are state-of-the-art for InP HEMT structures.

For all three channel compositions (Growths #2-5), the highest values of room-temperature mobility are found for buffer layer lattice constants of 5.97 to 6.00 Å. For smaller or larger lattice constants, the mobility drops substantially. The decrease for larger lattice constants was expected because of the large strains in the InAlAs and InGaAs layers. The In$_{0.52}$Al$_{0.48}$As barrier layers have a lattice constant of 5.869 Å and are in tension. For a 6.01 Å buffer layer, the strain is −2.41%. For buffer layers with smaller lattice constants, the strain is lower. For the 6.01 Å buffer layer, the channel strains vary from −1.65% for the In$_{0.64}$Ga$_{0.36}$As channel to −0.55% for the In$_{0.80}$Ga$_{0.20}$As channel and +0.81% for the InAs channel. Given the larger strains for the InAlAs barriers compared to the InGaAs channel and the similar results at the different channel compositions, it seems likely that the InAlAs layers exceed the critical layer thickness for the larger buffer layer lattice constants, resulting in the formation of misfit dislocations and a degradation in mobility. As can be seen from the Table in FIG. 3, high mobilities can be achieved for InAlAs strains up to −2.2%.

For lattice constants of 5.92-5.96 Å, strains in the InGaAs and InAlAs layers are smaller. For example, the InGaAs and InAlAs strains are −0.87 and −1.55%, respectively. Hence, strain-induced misfit dislocations cannot explain the lower mobilities. AFM measurements show rougher surfaces for all samples with buffer layers which have lattice constants less than 5.96 Å, with 5×5 μm rms roughness values between 1.3 and 3.1 nm. In contrast, samples with buffer layer lattice constants greater than 5.96 Å have rms values between 0.8 and 1.1 nm. These latter values are as good or better than what was measured for InAs-channel HEMT structures on Al(Ga)Sb buffer layers and GaAs or InP substrates and are fully compatible with monolithic-microwave integrated circuit (MMIC) processing. This does not imply that smooth buffer layers cannot be grown in the 5.92 to 5.96 Å regime. The optimal growth temperatures for arsenides are generally higher than for antimonides. Higher buffer layer growth temperatures might yield smoother layers in this range with smaller lattice constants and higher arsenide mole fractions. Our goal in this work, however, is to have buffer layers with lattice constants near 6.0 Å. Hence, we did not attempt to optimize the growth parameters for the smaller lattice constants.

Figure 5:
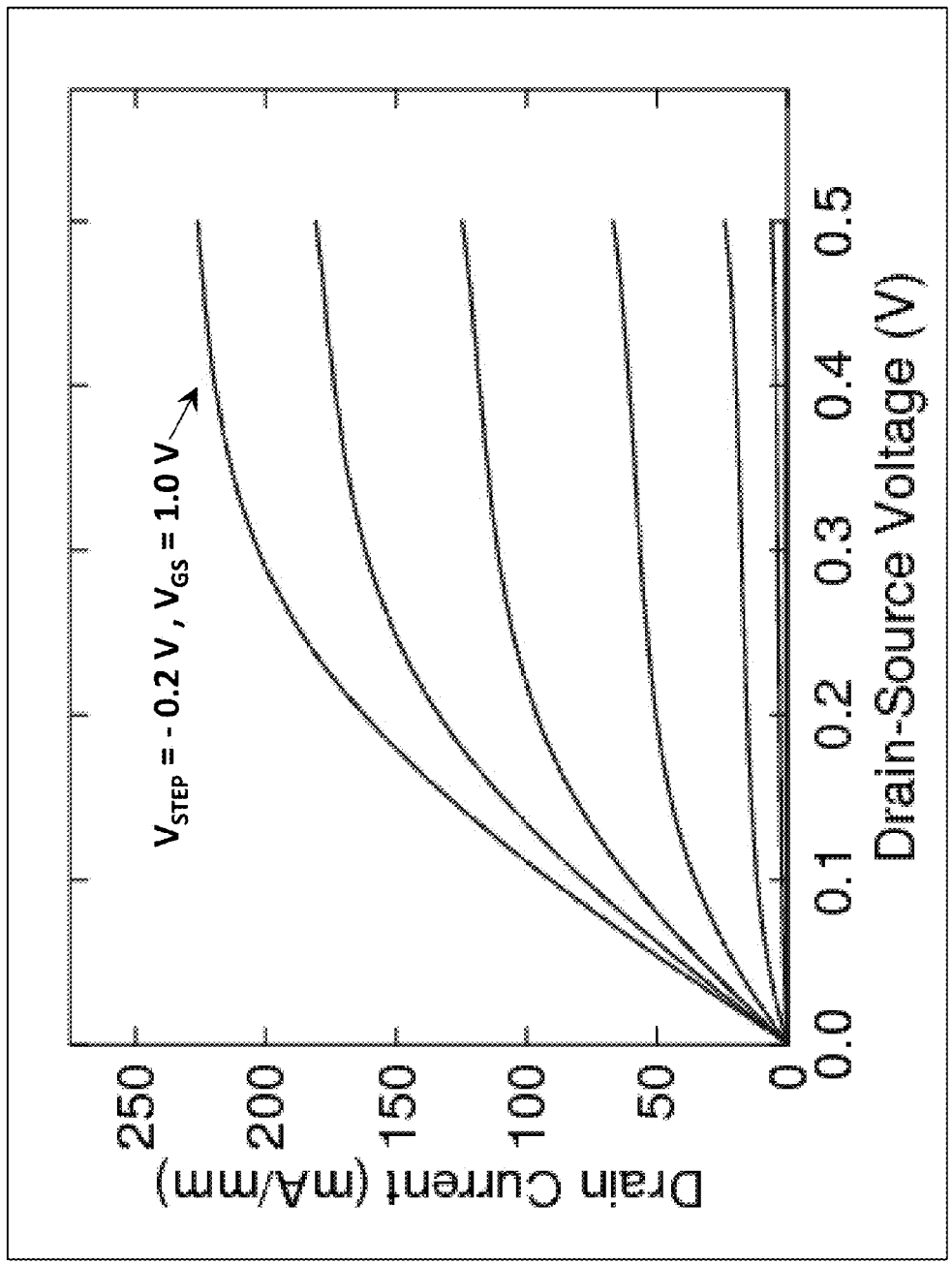
FIG. 5 is a plot illustrating the FET drain characteristics for an $In_{0.64}Ga_{0.36}As$-channel n-FET in tension.

Material from Growth #2 (In$_{0.64}$Ga$_{0.36}$As n-channel) was processed into HEMTs. The room-temperature sheet density and mobility were 3.5×10$^{12}$/cm$^2$ and 7900 cm$^2$/V-s, respectively. The HEMTs were fabricated using a Pd/Pt/Au alloyed source-drain metallization and a Ti/Au gate metallization using standard lithography and liftoff techniques. A typical set of drain characteristics for a HEMT with a 100 nm gate length is shown in FIG. 5. For this device, the gate width is 31 μm and the source-drain spacing is 1.4 μm. The low-field source-drain resistance at V$_{GS}$=1.0 V is 1.1 ohm-mm and the threshold voltage is 0.1 V. A maximum transconductance of 300 mS/mm is measured at V$_{DS}$=0.3 V. Using S-parameter measurements at V$_{DS}$=0.8V and V$_{GS}$=0.4V, an f$_T$ of 160 GHz and an f$_{max}$ of 120 GHz are obtained on a HEMT with a 90 nm gate length after removal of the gate bond capacitance. This corresponds to an $f_T$-$L_g$ product of 14 GHz-μm. At this bias condition, the gate leakage current was 1.4 μA/mm. These results would be considered state-of-the-art for conventional InP HEMTs. The key breakthrough here is that the layers are in tension and hence compatible with p-channel FETs on a common buffer layer.

Alternatives

Many other III-V CMOS alternatives also can be used by those skilled in the art in fabricating CMOS structures in accordance with the present invention.

For example, metal-organic chemical vapor deposition (MOCVD) could be used in place of MBE to form the layers in the heterostructure.

In some embodiments, GaAs or Si substrates can be used instead of InP, with appropriate buffer layer materials being chosen to accommodate the strain produced by a lattice-constant mismatch resulting from the use of such substrates. For example, the 5.97-6.00 Å AlGaAsSb buffer layers demonstrated here could be used with GaSb-channel p-FETs, but other buffer layer materials such as InGaAlAs can be used in place of AlGaAsSb, with buffer layers of the quinternary InGaAlAsSb also being a possibility.

In some embodiments, it may be desirable to use InGaSb alloys for the p-channel. See M. G. Ancona, *Solid-State Electronics* (2010), supra. In such a case, buffer layers with larger lattice constants (6.0-6.1 Å) will be needed to avoid excessive lattice mismatch with the InGaSb.

For the n-channel, barrier layers with larger InAs mole fractions, e.g. $In_{0.7}Al_{0.3}As$ could be used in place of $In_{0.52}Al_{0.48}As$.

In some embodiments, the second buffer layer can be an $Al_{0.8}Ga_{0.2}As_ySb_{1-y}$ digital alloy.

In some embodiments a conventionally Te-doped or Si-doped spacer layer can be used instead of the Te-delta doped spacer layer. For example, in some embodiments, the spacer layer can be in the form of a 3 nm layer of InAlAs doped with Te.

Recent work by the inventors demonstrated high-mobility (1000-1500 cm$^2$/V-s) GaSb QWs for compressive strains as high as 2.3%. See B. R. Bennett, T. F. Chick, M. G. Ancona, and J. B. Boos, "Enhanced hole mobility and density in GaSb quantum wells," *Solid State Electron.* 79 (2013) 274-280, the entirety of which is incorporated by reference into the present disclosure. Hence, a 5.97-6.00 Å AlGaAsSb buffer layer could be used with GaSb-channel p-FETs.

In other cases, it may be desirable to use InGaSb alloys for the p-channel. See B. R. Bennett, et al., *Applied Physics Letters* (2007), supra; and M. G. Ancona, et al., *Solid-State Electronics* (2010), supra. In such cases, buffer layers with larger lattice constants (6.0-6.1 Å) may be needed to avoid excessive lattice mismatch with the InGaSb.

Figure 6:
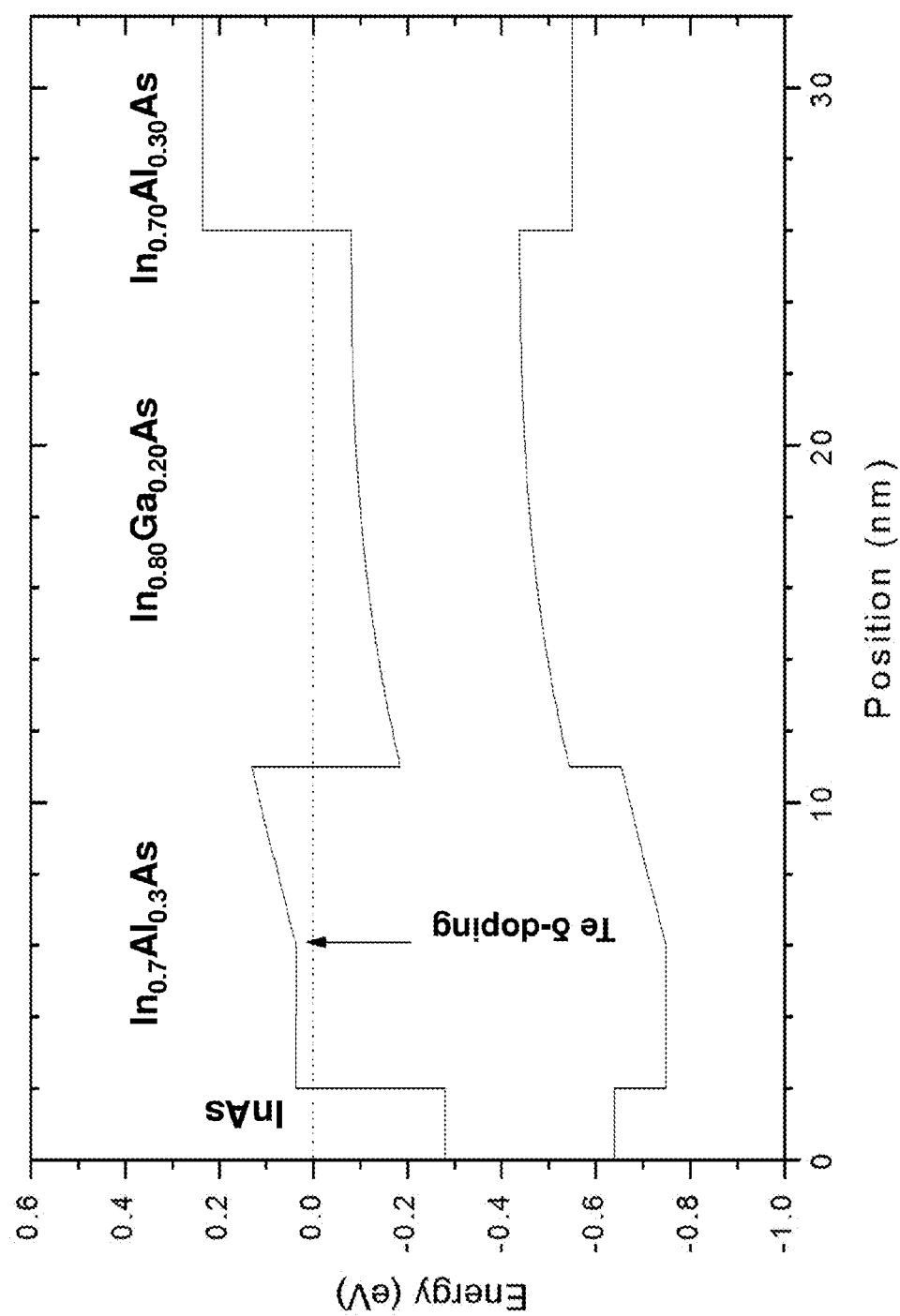
FIG. 6 are band diagrams for an $In_{0.80}Ga_{0.20}As/In_{0.70}Al_{0.30}As$ quantum well demonstrating sufficient conduction band offsets for electron confinement.

At these larger lattice constants, however, the lattice mismatch in the $In_{0.52}Al_{0.48}As$ barriers will be too large. An alternative is to use barriers with higher InAs mole fractions. The trade-off is that the conduction band offset will be smaller. To explore this option, we simulated a quantum well with $In_{0.7}Al_{0.3}As$ barriers and an $In_{0.80}Ga_{0.20}As$ well on a 6.05 Å AlGaAsSb buffer layer. The tensile strains in the barrier and channel are 1.87% and 1.21%, respectively. The band structure was calculated using the NEXTNANO program from NextNano GmbH, and is shown in FIG. 6. As can be seen in FIG. 6, the conduction band offset is 316 meV. This value is smaller than the offset for an $In_{0.52}Al_{0.48}As$/$In_{0.80}Ga_{0.20}As$ QW (570 meV), but may be sufficient for FET applications, as it is larger than the 200 meV offset for $In_{0.15}Al_{0.85}Sb$/InSb QWs used in high-performance FETs.

See Ashley et al., *Electronics Letters* (2007), supra. Although higher conduction band offsets could be achieved with InGaAs/Al(Ga)AsSb quantum wells, such structures would not be able to take full advantage of the maturity of the InGaAs/InAlAs HEMT technology.

The present invention thus provides an important step towards the development of complementary n- and p-channel FETs using antimonide-based compound semiconductors. Circuits from antimonides are projected to have an order-of-magnitude lower power consumption than existing Si-based digital and mixed-signal circuits. Many military systems such as hand-held or autonomous sensors could benefit greatly from A-to-D and D-to-A converters with extremely low power consumption.

It should be noted that although particular embodiments, aspects, and features have been described and illustrated, the invention described herein is not limited to only those embodiments, aspects, and features. Modifications may be made by persons skilled in the art, the present application contemplates any and all modifications within the spirit and scope of the underlying invention described and claimed herein, and all such embodiments are within the scope and spirit of the present disclosure.

What is claimed is:

1. An InGaAs n-channel quantum well heterostructure, comprising:
   a substrate;
   a first buffer layer disposed on the substrate, the first buffer layer being lattice-matched to the substrate;
   a second buffer layer disposed on the first buffer layer;
   a barrier layer disposed on the second buffer layer an $In_xGa_{1-x}As$, x=0.64 to 1, n-channel layer disposed on the second buffer layer, the $In_xGa_{1-x}As$ n-channel material having a first lattice constant;
   a barrier layer disposed on the n-channel layer;
   a spacer layer disposed on the barrier layer;
   and a second barrier layer disposed on the spacer layer;
   wherein the heterostructure is configured for use with an antimonide-based p-channel material in a complementary transistor, the p-channel material having a second lattice constant different from the first lattice constant, a difference between the first and second lattice constants producing a strain between the n- and p-channels in the complementary transistor;
   wherein the second buffer layer serves as a buffer layer for both the n- and p-channels in the complementary transistor; and
   wherein the second buffer layer is configured to have a third lattice constant intermediate the first and second lattice constants and is configured to accommodate the strain produced by a lattice-constant mismatch between the n- and p-channels in the complementary transistor.

2. The quantum well heterostructure according to claim 1, wherein the second buffer layer is AlGaAsSb.

3. The quantum well hetero structure according to claim 1, wherein the second buffer layer is InGaAlAs.

4. The quantum well heterostructure according to claim 1, wherein the second buffer layer is configured to reduce a strain produced by a GaSb p-channel material.

5. The quantum well hetero structure according to claim 4, wherein the second buffer layer has a lattice constant of 5.97 to 6.00 Å.

6. The quantum well heterostructure according to claim 1, wherein the second buffer layer is configured to reduce a strain produced by an InGaSb p-channel material.

7. The quantum well hetero structure according to claim 6, wherein the second buffer layer has a lattice constant of 6.0 to 6.1 Å.

8. An InGaAs n-channel quantum well hetero structure, comprising:
- an InP substrate;
- an $In_{0.52}Al_{0.48}As$ first buffer layer disposed on the substrate, the $In_{0.52}Al_{0.48}As$ first buffer layer being lattice-matched to the substrate;
- an $Al_{0.8}Ga_{0.2}As_ySb_{1-y}$ second buffer layer disposed on the first buffer layer;
- an $In_{0.52}Al_{0.48}As$ first barrier layer disposed on the second buffer layer;
- an $In_xGa_{1-x}As$, x=0.64 to 1, n-channel layer disposed on the first barrier layer, the $In_xGa_{1-x}As$ n-channel material having a first lattice constant;
- an $In_{0.52}Al_{0.48}As$ second barrier layer disposed on the n-channel layer;
- a Te-delta doped $In_{0.52}Al_{0.48}As$ spacer layer disposed on the $In_{0.52}Al_{0.48}As$ second barrier layer;
- and a $In_{0.52}Al_{0.48}As$ third barrier layer disposed on the Te-delta doped $In_{0.52}Al_{0.48}As$ spacer layer;
- wherein the heterostructure is configured for use with an antimonide-based p-channel material in a complementary transistor, the p-channel material having a second lattice constant different from the first lattice constant, a difference between the first and second lattice constants producing a strain between the n- and p-channels in the complementary transistor;
- wherein the $Al_{0.8}Ga_{0.2}As_ySb_{1-y}$ second buffer layer serves as a buffer layer for both the n- and p-channels in the complementary transistor; and
- wherein the $Al_{0.8}Ga_{0.2}As_ySb_{1-y}$ second buffer layer is configured to have a third lattice constant intermediate the first and second lattice constants and is configured to accommodate the strain produced by a lattice-constant mismatch between the n- and p-channels in the complementary transistor.

9. The quantum well heterostructure according to claim 8, wherein the $Al_{0.8}Ga_{0.2}As_ySb_{1-y}$ second buffer layer is configured to reduce a strain produced by a GaSb p-channel material.

10. The quantum well heterostructure according to claim 8, wherein the $Al_{0.8}Ga_{0.2}As_ySb_{1-y}$ second buffer layer is configured to reduce a strain produced by an InGaSb p-channel material.

* * * * *